United States Patent
Lin et al.

(10) Patent No.: US 10,658,252 B2
(45) Date of Patent: *May 19, 2020

(54) SEMICONDUCTOR STRUCTURE AND METHOD FOR FORMING THE SAME

(71) Applicant: Taiwan Semiconductor Manufacturing Company, Ltd., Hsinchu (TW)

(72) Inventors: Jia-Ming Lin, Hsinchu (TW); Wei-Ken Lin, Tainan (TW); Shiu-Ko JangJian, Tainan (TW); Chun-Che Lin, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/390,828

(22) Filed: Apr. 22, 2019

(65) Prior Publication Data

US 2019/0252273 A1 Aug. 15, 2019

Related U.S. Application Data

(60) Continuation of application No. 15/782,161, filed on Oct. 12, 2017, now Pat. No. 10,269,664, which is a
(Continued)

(51) Int. Cl.
*H01L 21/66* (2006.01)
*H01L 21/311* (2006.01)
(Continued)

(52) U.S. Cl.
CPC ........ *H01L 22/26* (2013.01); *H01L 21/31105* (2013.01); *H01L 21/31155* (2013.01);
(Continued)

(58) Field of Classification Search
CPC ............... H01L 29/785; H01L 29/7846; H01L 21/76224; H01L 21/823481; H01L 29/4236; H01L 29/0642
See application file for complete search history.

(56) References Cited

U.S. PATENT DOCUMENTS 6,214,698 B1  4/2001  Liaw et al.
8,809,173 B1  8/2014  Yin et al.
(Continued)

FOREIGN PATENT DOCUMENTS

CN  104022037 A  9/2014
TW  201330264 A  7/2013
(Continued)

*Primary Examiner* — Julia Slutsker
(74) *Attorney, Agent, or Firm* — Slater Matsil, LLP

(57) ABSTRACT

A semiconductor structure with a stop layer for planarization process therein and a method for forming the same is disclosed. The method includes the steps of: forming a trench in a substrate and between active areas; filling the trench with isolation layer; doping the isolation layer with an element to form a doped isolation region; annealing the doped isolation region; and planarizing the annealed and doped isolation region and measuring a planarization depth thereof. The coefficients of thermal expansion (CTEs) of the stop layer, the dielectric layer, and the active area are different.

20 Claims, 16 Drawing Sheets

Related U.S. Application Data division of application No. 15/082,399, filed on Mar. 28, 2016, now Pat. No. 9,824,943.

(60) Provisional application No. 62/243,854, filed on Oct. 20, 2015.

(51) Int. Cl.
*H01L 21/8234* (2006.01)
*H01L 21/84* (2006.01)
*H01L 21/3115* (2006.01)
*H01L 21/762* (2006.01)
*H01L 29/78* (2006.01)

(52) U.S. Cl.
CPC .......... *H01L 21/76224* (2013.01); *H01L 21/823431* (2013.01); *H01L 21/845* (2013.01); *H01L 22/12* (2013.01); *H01L 29/785* (2013.01); *H01L 29/7846* (2013.01); *H01L 21/823481* (2013.01)

(56) References Cited

U.S. PATENT DOCUMENTS

| | | | |
|---|---|---|---|
| 10,269,664 B2 * | 4/2019 | Lin | H01L 21/31105 |
| 2005/0215026 A1 | 9/2005 | Ohashi et al. | |
| 2012/0299115 A1 | 11/2012 | Chuang et al. | |
| 2013/0039664 A1 | 2/2013 | Clifton et al. | |
| 2013/0092984 A1 | 4/2013 | Liu et al. | |
| 2015/0001687 A1 | 1/2015 | Zhang et al. | |
| 2015/0021691 A1 | 1/2015 | Akarvardar et al. | |
| 2015/0069474 A1 | 3/2015 | Ching et al. | |
| 2015/0200127 A1 * | 7/2015 | Chuang | H01L 21/76205 257/622 |
| 2015/0228725 A1 | 8/2015 | Tsai et al. | |
| 2015/0249320 A1 | 9/2015 | Clifton et al. | |

FOREIGN PATENT DOCUMENTS

| | | |
|---|---|---|
| TW | 201419413 A | 5/2014 |
| TW | 201528458 A | 7/2015 |
| WO | 2014035556 A1 | 3/2014 |

* cited by examiner

SEMICONDUCTOR STRUCTURE AND METHOD FOR FORMING THE SAME

PRIORITY CLAIM AND CROSS-REFERENCE

This application is a continuation of U.S. patent application Ser. No. 15/782,161, filed on Oct. 12, 2017, entitled "Semiconductor Structure and Method for Forming the Same," which is a divisional of U.S. patent application Ser. No. 15/082,399, filed on Mar. 28, 2016, now U.S. Pat. No. 9,824,943, issued on Nov. 21, 2017, entitled "Semiconductor Structure and Method for Forming the Same," which claims the benefit of U.S. Provisional Application No. 62/243,854, filed on Oct. 20, 2015, which applications are hereby incorporated herein by reference.

BACKGROUND

Semiconductor devices are used in a large number of electronic devices, such as computer, communication, consumer electronics, cars and others. Semiconductor devices comprise integrated circuits (ICs) that are formed on semiconductor wafers by depositing many types of thin films of material over the semiconductor wafers, and patterning the thin films of material to form the integrated circuits. The most common active element in the ICs is transistor including planar field-effect transistors (FETs) such as metal oxide semiconductor (MOS) transistors and 3D fin field-effect transistors (FinFETs).

In the integrated circuit, a trench isolation structure is frequently used to separate and insulate two active areas in a semiconductor device. The trench isolation structure is typically formed by recessing a substrate, overfilling a dielectric material therein, and performing a planarization process thereof. However, precisely controlling a planarization depth and adequately maintaining the structure stability between the trench isolation structure and adjacent structures are still a challenge.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
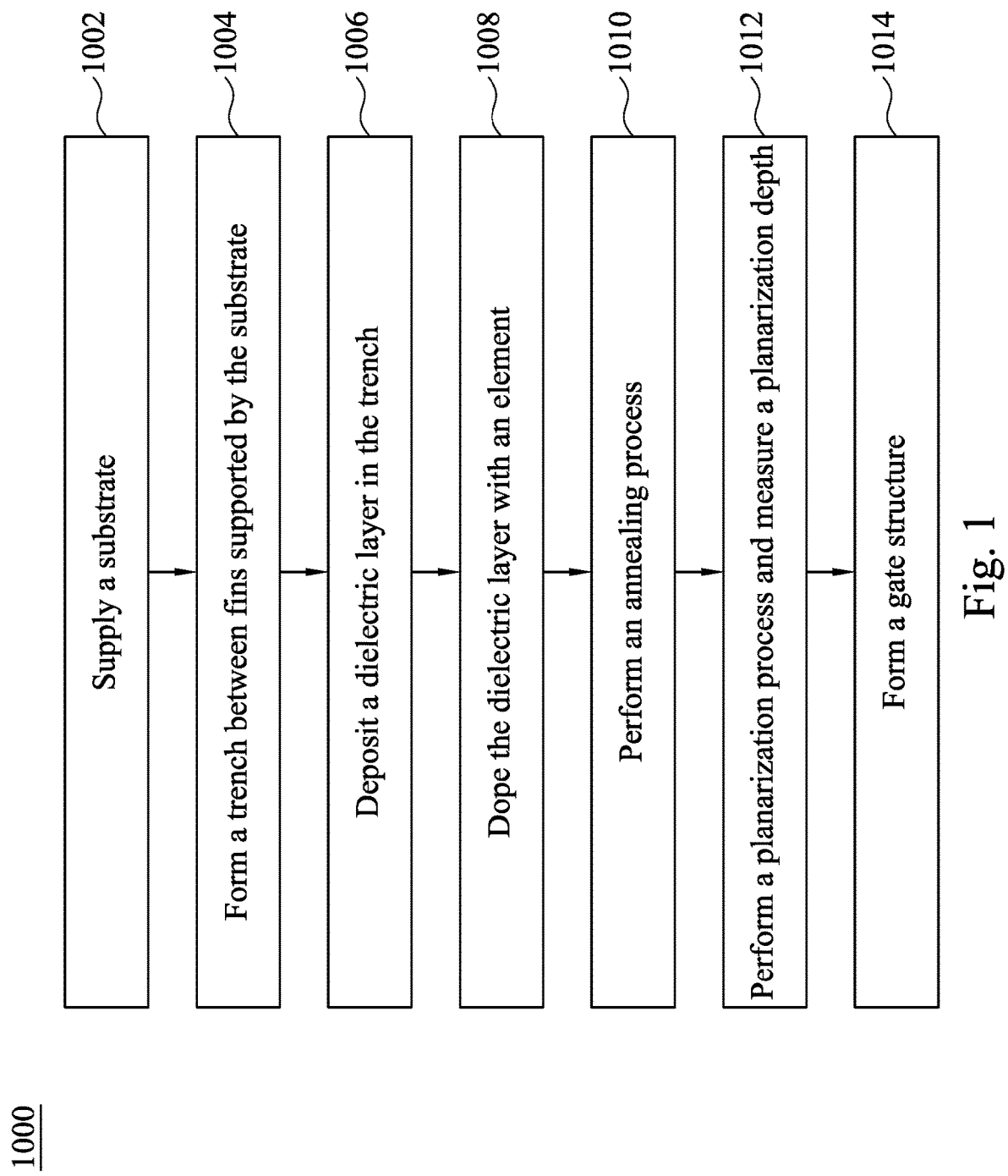
FIG. 1 illustrates a flow chart of an example method for fabricating a FinFET semiconductor structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The singular forms "a," "an" and "the" include plural referents unless the context clearly dictates otherwise. Therefore, reference to, for example, a conductive plug includes aspects having two or more such plug, unless the context clearly indicates otherwise. Further, spatially relative terms, such as "beneath," "below," "lower," "above," "upper" and the like, may be used herein for ease of description to describe one element or feature's relationship to another element(s) or feature(s) as illustrated in the figures.

As transistor sizes decrease, the sizes of various features associated with forming transistors also decrease. One of the features is the trench isolation structure formed between active areas to provide isolation. It is known that as the feature size scales down, the aspect ratios of the trench isolation structure becomes larger because the openings are smaller but not the depth of the trench isolation structure. Techniques used to anneal the trench isolation structure for removing undesired elements of the trench isolation structure having lower aspect ratios cannot be used to adequately anneal the trench isolation structure of advanced technologies having high aspect ratios.

For example, after trench isolation structures are formed between fins in a fin field-effect (FinFET), an annealing process performed afterward on the trench isolation structures may cause a structural stress on the thin fins that may result in defects, such as fin bending or cracking, to the fins. To be more precisely, the shrinkage of the trench isolation structure during the annealing process may cause a tensile or compressive stress on the fins depending on different sets of materials adjacent to each other, thus defects may occur in a semiconductor structure. In addition, during the planarization process, such as etching or chemical mechanical polishing (CMP), it is difficult to precisely control an etching depth by traditional etching parameters, such as etching time.

To solve the problems resulted from manufacturing process related to trench isolation structures with high aspect ratio, one alternative way to prevent the defects mentioned above from occurring is to change material characteristics of the isolation trench structure, for example, the coefficient of thermal expansion (CTE). It is known that the CTE of silicon used in a substrate and fins is about 2.5/K while the CTE of silicon oxide used in dielectric layer is 0.5E-6/K. Such a large difference of the CTEs may apply a large structural stress on a semiconductor structure during an annealing process. However, in the disclosure, by doping a foreign element (or foreign elements) into the trench isolation structure to modify the CTE thereof, the structural stress may be reduced or eliminated to maintain structural stability of the semiconductor structure. In addition, the concentration of the foreign element doped into the trench isolation structure forms a Gaussian distribution, which can be analyzed and detected by energy-dispersive X-ray spectroscopy (EDX) mapping. Furthermore, by adjusting doping parameters and measuring the concentration of the foreign element repeatedly, a predetermined concentration profile of the foreign element can be formed. Then, based on the predetermined concentration profile of the foreign element, a concentration of the foreign element measured in a planarization process provides a stop signal and information about planarization depth as well. It should be noticed that the predetermined concentration profile of the foreign element and the concentration of the foreign element measured in the planarization process are both along the planarization depth of the trench isolation structure doped with the foreign element, namely, perpendicular to a top surface of the trench isolation structure. Since the planarization process is terminated at the trench isolation structure doped with the foreign element by receiving the stop signal or reaching a predetermined planarization depth, the trench isolation structure doped with the foreign element works as a stop layer.

It should be noticed that the problems of defects and precise controlling of a planarization depth of planarization process are not limited to 3D FinFETs but to planar FETs as well as other semiconductor devices such as, but not limited to, tubular FET, metal oxide semiconductor field effect transistor (MOSFET), thin film transistor (TFT), and bases or emitters of a bipolar complementary metal oxide semiconductor (BCMOS) device. In addition, the trench isolation structure indicates the structure between two active areas in a semiconductor structure, which is not limited to shallow trench isolation (STI). Here, two types of semiconductor structures are used according to the embodiments to illustrate the disclosure. The methods and processes related to 3D FinFETs are summarized in FIG. 1, and discussed in detail with referring to figures from FIG. 2A through FIG. 2G. On the other hand, the methods and processes related to planar FETs are summarized in FIG. 3, and discussed in detail with referring to figures from FIG. 4A through FIG. 4E.

Now referring to FIG. 1, which is an exemplary flow chart for manufacturing a FinFET structure according to one embodiment of the present disclosure. The flow chart illustrates only a relevant part of the entire manufacturing process. It is understood that additional operations may be provided before, during, and after the operations shown by FIG. 1, and some of the operations described below can be replaced or eliminated for additional embodiments of the method. The order of the operations/processes may be interchangeable.

As shown in FIG. 1, an embodiment method 1000 of controlling fin bending or cracking of a FinFET is provided. In step 1002, a substrate is supplied. In step 1004, a trench is formed between fins supported by the substrate. In step 1006, a dielectric layer is deposited in the trench. In step 1008, the dielectric layer is doped with a foreign element. In step 1010, an annealing process is performed. In step 1012, a planarization process is performed on the substrate to expose the fins and a planarization depth is measured. In step 1014, a gate structure is formed.

Figure 2A:
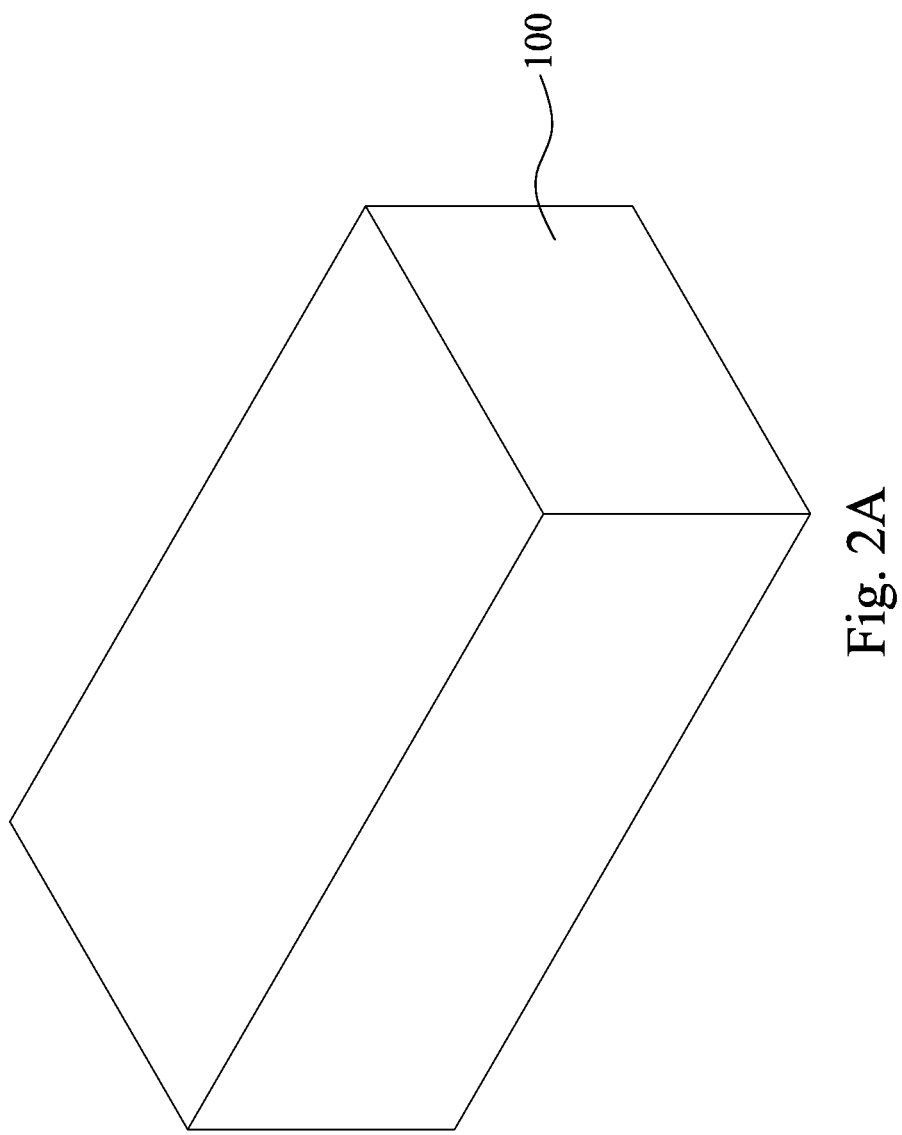
FIGS. 2A through 2G illustrate various structures of a FinFET semiconductor structure at different stages of fabrication in accordance with some embodiments.

Referring to FIG. 1 and FIG. 2A, the method 1000 starts from 1002 by supplying a substrate 100. The substrate 100 may be a bulk silicon substrate. Alternatively, the substrate 100 may comprise an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or a combination thereof. Further, the substrates 100 may also include a silicon-on-insulator (SOI) substrate. Generally, an SOI substrate comprises a layer of a semiconductor material such as silicon (Si), germanium (Ge), silicon germanium (SiGe), silicon germanium on insulator (SGOI), or a combination thereof. The SOI substrate 100 is fabricated using separation by implantation of oxygen (SIMOX), wafer bonding, and/or other suitable methods. Other substrates that may be used include multi-layered substrates, gradient substrates, or hybrid orientation substrates. In the embodiment, the substrate 100 is a bulk silicon substrate. That is to say, a fin structure, which will be discussed latter, is physically connected to the substrate 100.

Figure 2B:
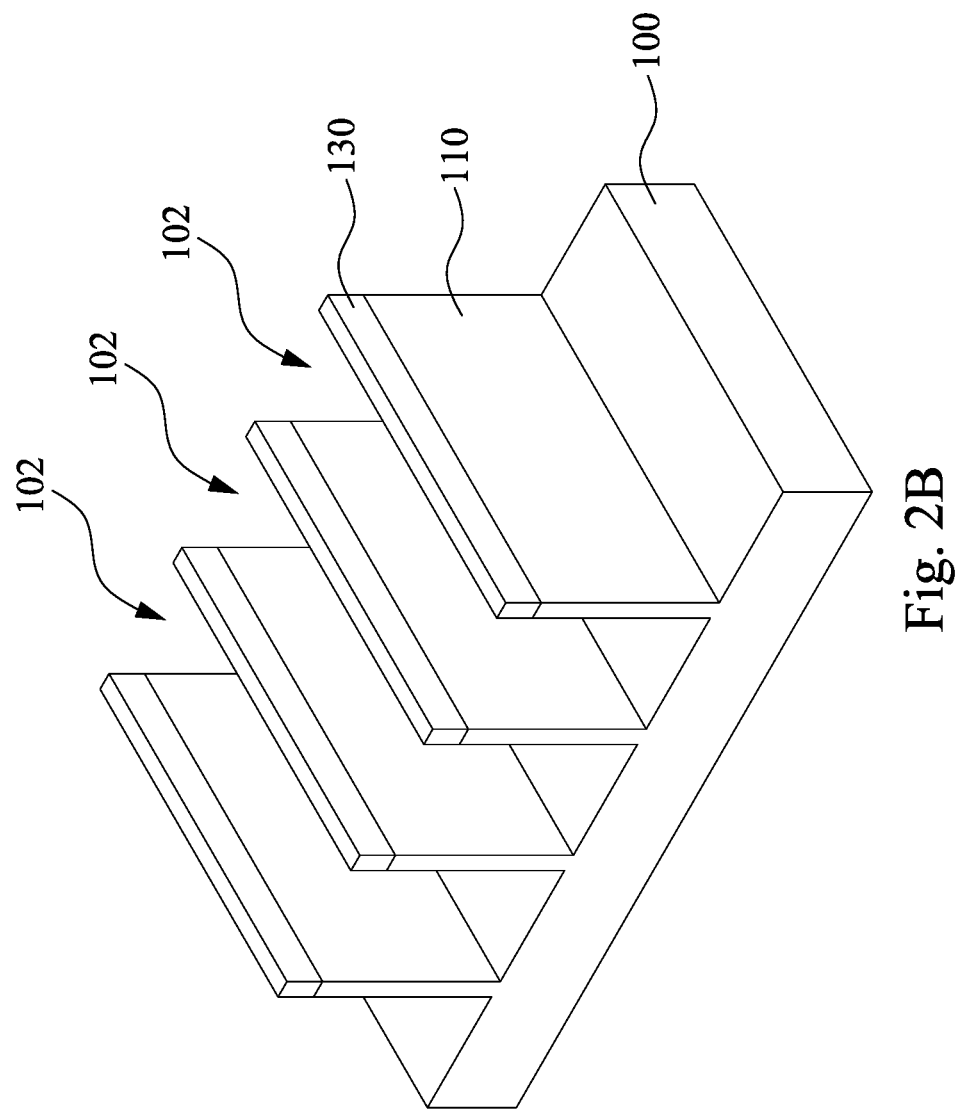

Referring to FIG. 1 and FIG. 2B, the method 1000 proceeds to step 1004 by forming a trench 102 between fin structures 110 supported by the substrate 100. To form the trench 102 and the fin structure 110, a hard mask 130 is formed first and followed by an etching process to remove a portion of the substrate 100 not covered and protected by the hard mask 130, thus the fin structure 110 is formed between the two trenches 102. The hard mask 130 may be formed by depositing a hard mask layer (not shown) through a suitable process such as, but not limited to, chemical vapor deposition (CVD), plasma enhanced chemical vapor deposition (PECVD), low pressure chemical vapor deposition (LPCVD), or even silicon oxide formation followed by nitridation, may alternatively be utilized. In addition, the hard mask layer (not shown) may be any suitable material such as titanium oxide ($TiO_2$), tantalum oxide (TaO), silicon nitride (SiN), silicon oxide ($SiO_2$), silicon carbide (SiC), silicon carbide nitride (SiCN), and a combination thereof. Once formed, the hard mask layer (not shown) is patterned through a suitable photolithographic process to form a pattern. In the pattern, a portion of the hard mask layer over the substrate configured to be the fin structure 110 is remained to form the hard mask 130, while other portion of the hard mask layer over part of the substrate 100 configured to be the trench 102 is removed. After the hard mask 130 forms, an etching process is performed to remove a portion of the substrate 100 not covered and protected by the hard mask 130 so that the fin structure 110 is formed between the hard mask 130 and the substrate 100.

In other embodiments, instead of using the hard mask 130, a photo resist layer (not shown) may be formed directly on the substrate 100. Continuing with the photolithographic process to form a patterned photo resist layer (not shown). Then etching the photo resist layer as well as the substrate 100 by a suitable process to form fin structure 110. In some embodiments, the substrate 100 and the fin structure 110 are made of the same material. In some embodiments, the substrate 100 and the fin structure 110 are integrally formed, which there is no boundary between the substrate 100 and the fin structure 110.

Figure 2C:
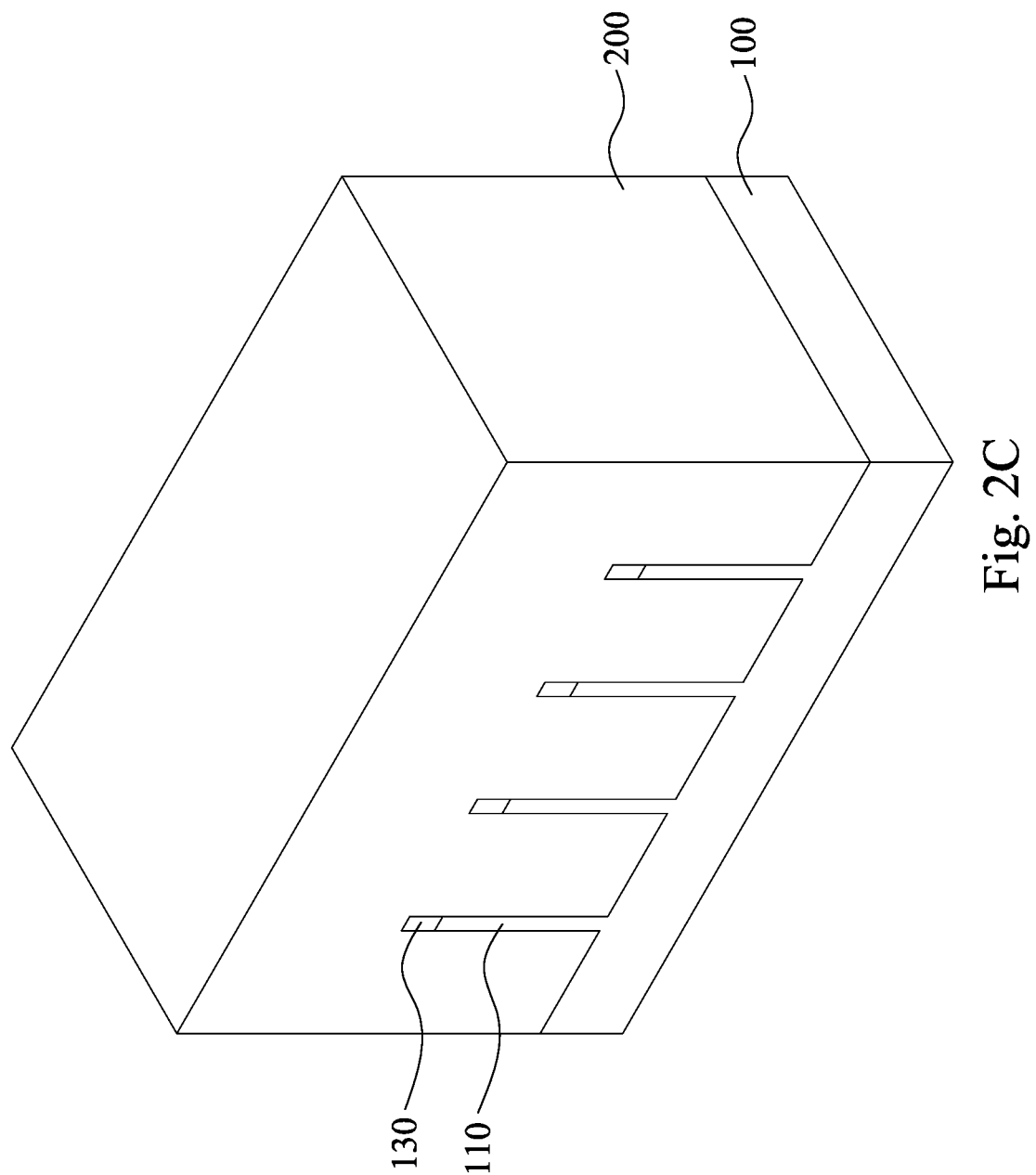

Referring to FIG. 1 and FIG. 2C, the method 1000 proceeds to step 1006 by depositing a dielectric layer 200 in the trench 102. As shown in FIG. 2C, the dielectric layer 200 configured to separate the two fin structures 110 is deposited in the trench 102. The dielectric layer 200 functions as an insulating layer or an isolation layer and comprises any suitable insulating materials such as, but not limited to, silicon oxide ($SiO_2$), silicon nitride (SiN), silicon oxynitride (SiON), fluoride-doped silicate glass, a low-k dielectric material, and a combination thereof. As used herein, the term "low-k dielectric" refers to the material having a dielectric constant, k, smaller than about 3.9, which is the k value of $SiO_2$. The dielectric layer 200 may also comprise flowable material such as, but not limited to, silicate, siloxane, methyl SilsesQuioxane (MSQ), hydrogen SisesQuioxane (HSQ), MSQ/HSQ, perhydrosilazane (TCPS), perhy-dro-polysilazane (PSZ), a tetraethyl orthosilicate (TEOS), or a silylamine, such as trisilylamine (TSA). In addition, the dielectric layer 200 may be formed by any suitable process, such as, but not limited to, chemical vapor deposition (CVD), atmospheric pressure chemical vapor deposition (APCVD), low pressure chemical vapor deposition (LPCVD), plasma enhanced chemical vapor deposition (PECVD), metal-organic chemical vapor deposition (MOCVD), flowable chemical vapor deposition (FCVD), physical vapor deposition (PVD), atomic layer deposition (ALD), chemical solution deposition, sputtering, and a combination thereof.

It should be noticed that different topography of the dielectric layer 220 may affect the afterward ion implantation process as well as a topography of the doped dielectric layer, which will be mentioned in detail. In the embodiment, sidewalls of the fin structure 110 and a top surface of the hard mask 130 are covered by the dielectric layer 200. In another embodiment, the dielectric layer 200 may be partially removed to expose the fin structures 110. In yet another embodiment, the dielectric layer 200 may have a height as same as the fin structure 110. In yet another embodiment, the dielectric layer 200 may be partially deposited over the substrate 100 to have a top surface lower than a top surface of the fin structure 110.

Figure 2D:
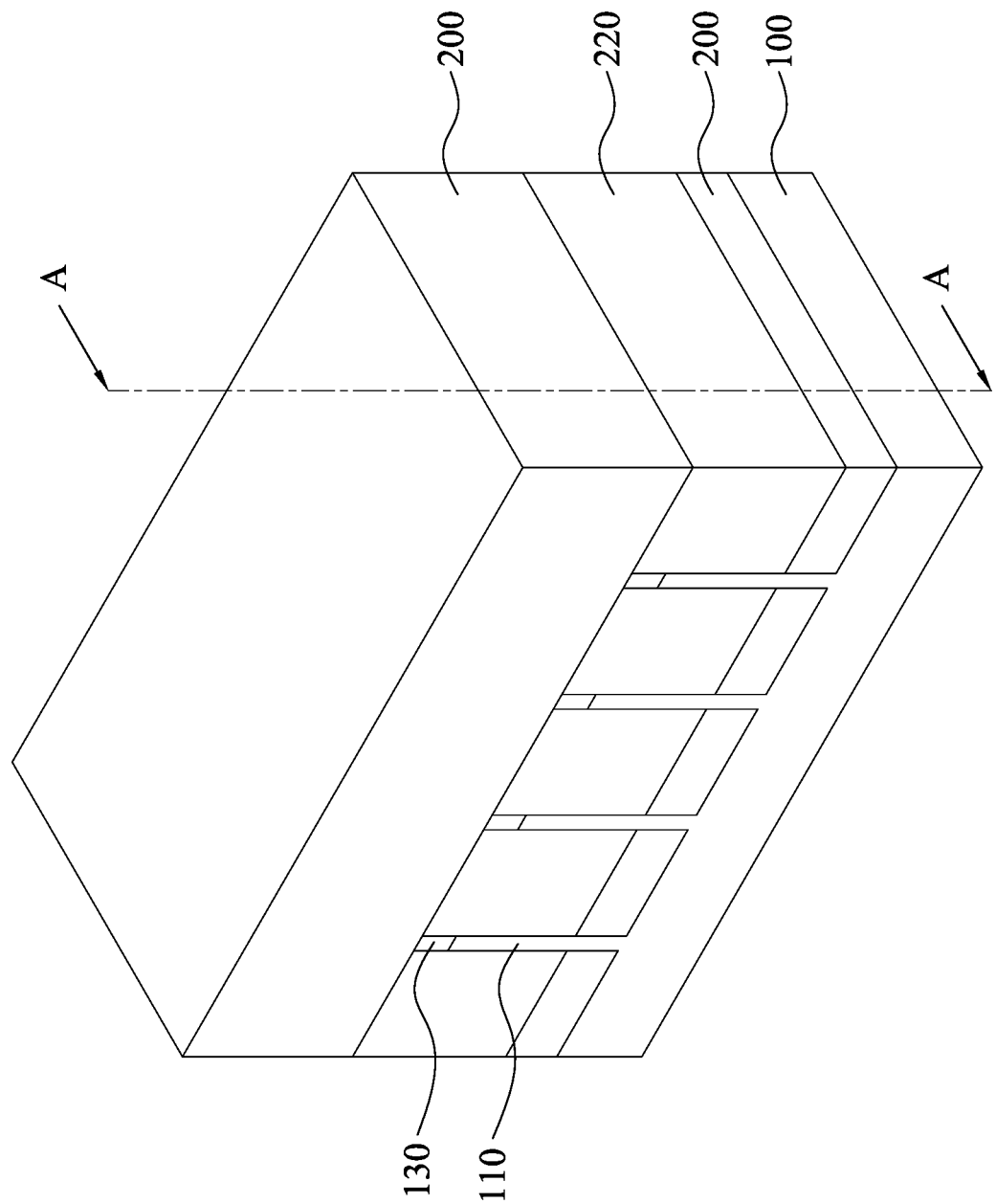

Referring to FIG. 1 and FIG. 2D, the method 1000 proceeds to step 1008 by doping the dielectric layer 200 with a foreign element. As shown in FIG. 2D, a portion of the dielectric layer 200 is doped with a foreign element to form a doped dielectric layer 220. It should be noticed that the doped dielectric layer 220 functions as a stop layer during a planarization process, which will be discussed latter. The dielectric layer 200 can be doped by any suitable process such as, but not limited to, ion implantation, plasma doping, laser doping, and a combination thereof. In the embodiment, the dielectric layer 200 is doped by an ion implantation process. In addition, the foreign element may be any suitable element such as a metalloid element or a nonmetal element includes, but not limited to, boron (B), carbon (C), nitrogen (N), phosphorum (P), germanium (Ge), and a combination thereof. It should be noticed that the foreign element can be a single element or any combination of different elements. In addition, the foreign element doped into the dielectric layer 200 should not enhance an electrical conductivity of the dielectric layer 200. Because increasing of the electrical conductivity of the dielectric layer 200, which is configured to separate different conductive features or active areas, may increase a current leakage and parasitic capacitance that worsen performance of a semiconductor structure. As mentioned above, the foreign element doped into the dielectric layer 200 has better effects to reduce a structural stress between the dielectric layer 200 and the fin structure 110 during an annealing process, which will be discussed in detail latter.

Furthermore, a position and a thickness of the doped dielectric layer 220 can be controlled by ion implantation parameters such as, but not limited to, kind of ions, implantation time, implantation angle, and implantation energy. By properly setting the parameters, the doped dielectric layer 220 can be formed in a desired position with a desired thickness. In addition, multiple ion implantations of different kinds of foreign elements may be conducted to obtain a desired doped structure of unique characteristics, position, and thickness. In the embodiment, the doped dielectric layer 220 is formed in the dielectric layer 200 adjacent a upper portion of the fin structures 110, wherein the doped dielectric layer 220 has a top surface at a same level to a top surface of the hard mask 130. In another embodiment, the doped dielectric layer 220 may be formed in the dielectric layer 200 adjacent a lower portion of the fin structure 110, wherein the doped dielectric layer 220 has a top surface lower than the top surface of the fin structure 110. In yet another embodiment, the doped dielectric layer 220 may be formed adjacent a middle portion of the fin structure 110. In yet another embodiment, the doped dielectric layer 220 replaces the entire dielectric layer 200.

It should be noticed that the foreign element forms a Gaussian distribution in the doped dielectric layer 220 through ion implantation. Hence, by adjusting the doping parameters, a predetermined concentration profile of the foreign element can be formed. In addition, the predetermined concentration of the foreign element can be further revised by adjusting doping parameters and measuring the concentration of the foreign element repeatedly. Based on the predetermined concentration, a measured concentration of the foreign element during a subsequent planarization can provide a stop signal and information related to a planarization depth, which will be discussed latter.

Referring to FIG. 1 and FIG. 2D, the method 1000 proceeds to step 1010 by performing an annealing process. It is understood for one with skilled art that the annealing process is aimed to release structural stress of the dielectric layer 200 and expel impurities from the dielectric layer 200. That is to say, the former is relocating position of atoms to compensate or eliminate defects in material, while the latter is removing undesired elements by diffusing them out of material. In particular, the deposition process of the dielectric layer 200 may cause a plurality of defects needed to be eliminate before following manufacturing process. However, during the annealing of the dielectric layer 200, the shrinkage of the dielectric layer 200 will cause a structural stress on the adjacent structure (i.e. the fin structure 110) so that the fin structure 110 may be bending or even cracking. However, in the disclosure, the doped dielectric layer 220 may have a coefficient of thermal expansion (CTE) closer to the fin structure 110. Hence, the defects of fin structure 110 such as fin bending or cracking may be avoided during the annealing process. For example, during the annealing process, a stress exerted by the doped dielectric layer 220 on the fin structure 110 ranges from about 0.15 GPa to −0.2 GPa, wherein a positive value represents a tensile stress, while a negative value represents a compressive stress. To be more precise, the tensile stress applied by the doped dielectric layer 220 on the fin structure 110 is in a range from 0.01 GPa to 0.15 GPa, while the applied compressive stress is in a range from 0.01 GPa to 0.2 GPa. In some embodiment, the annealing process and the ion implantation process are performed at the same time. In other embodiments, the annealing process may comprise multiple annealing processes with/without steam or various gases. In other embodiments, the annealing process and the aforementioned ion implantation process may be performed at the same time. In some embodiments, additional annealing process may be performed after the planarization process afterward.

Figure 2E:
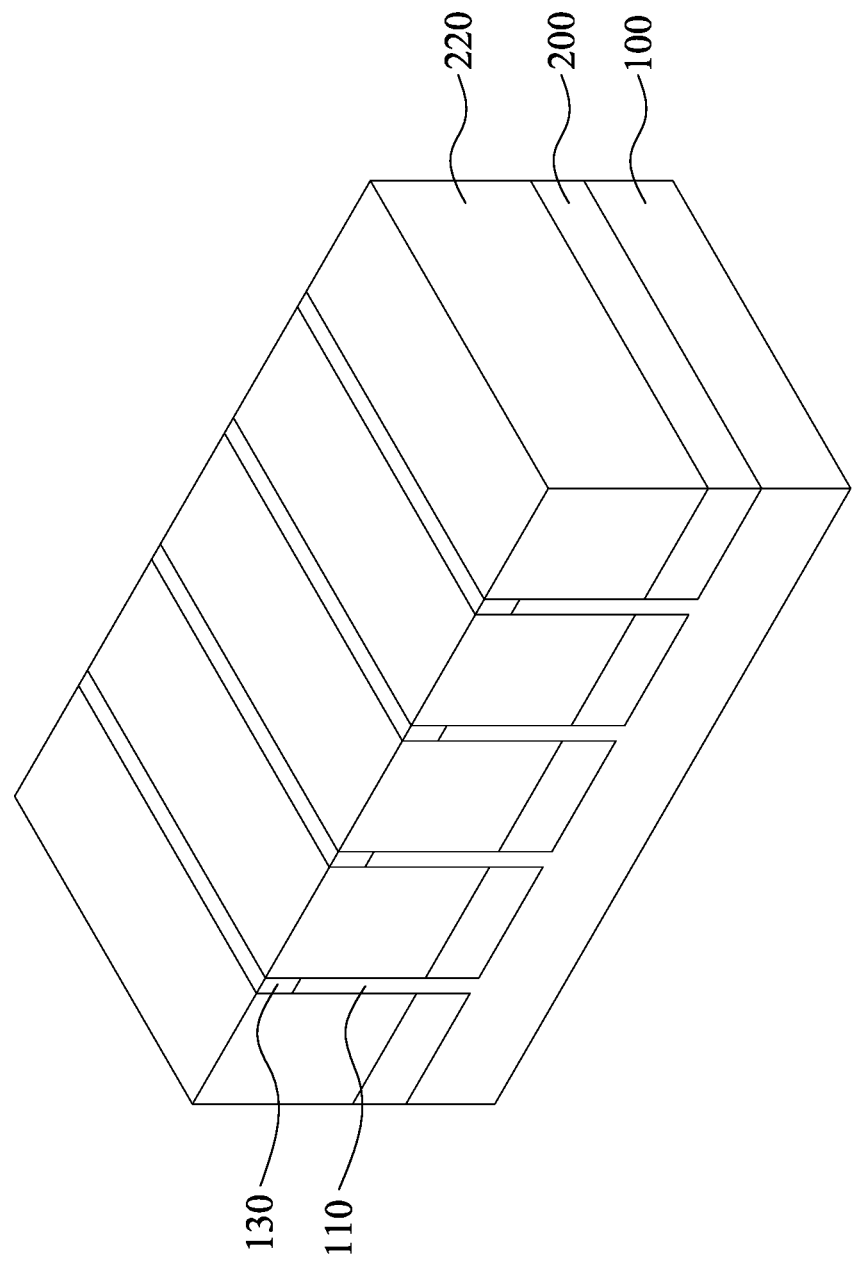
Figure 2F:
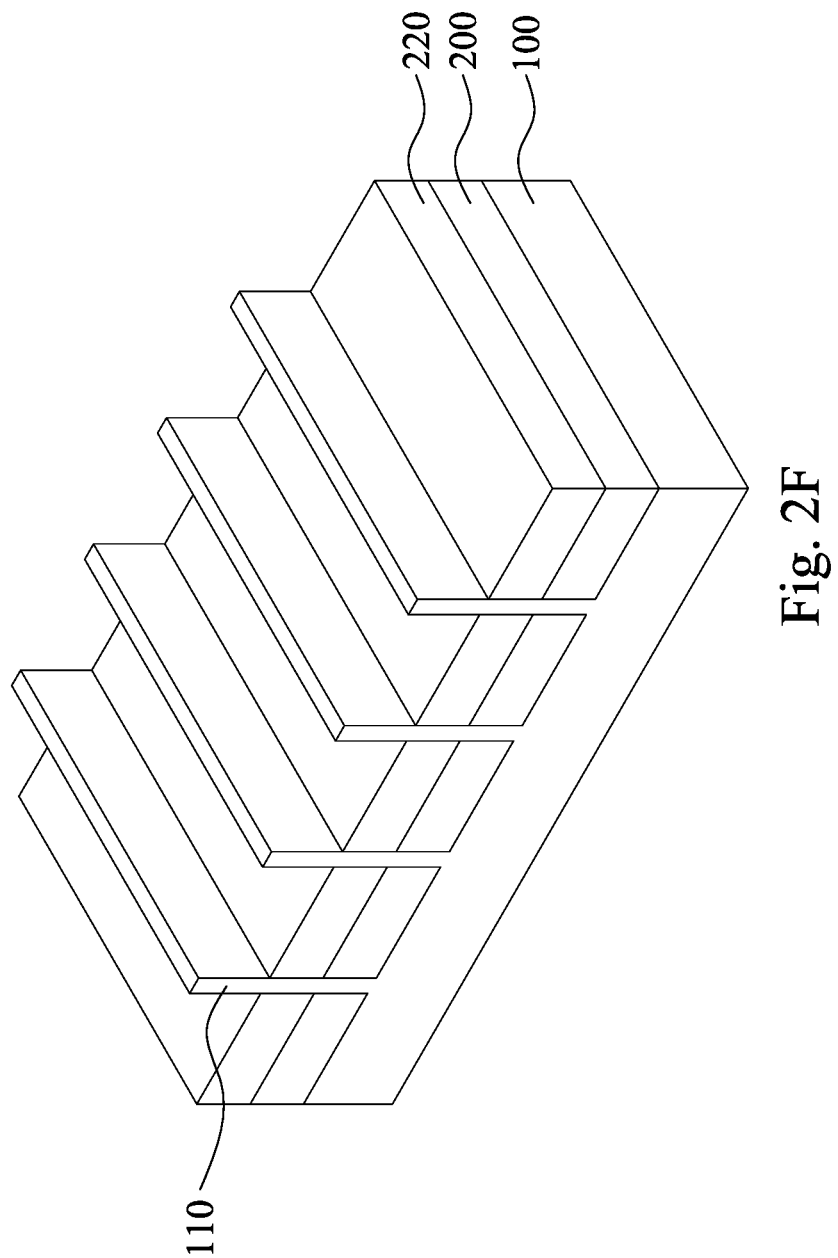

Referring to FIG. 1 and FIGS. 2E-2F, the method 1000 proceeds to step 1012 by performing a planarization process and measuring a planarization depth. As shown in FIG. 2E, a upper portion of the dielectric layer 200 in FIG. 2D is removed by a suitable process such as, but not limited to, wet etching, dry etching, and chemical mechanical polishing (CMP), to expose the doped dielectric layer 220 and the hard mask 130. It is understood that FIG. 2E may represent a certain stage during an overall planarization process. A subsequent removing process may continue to be performed for desired structure. For example, removing the hard mask 130 and a portion of the dielectric layer to expose the fin structure 110 and the doped dielectric layer 220 as shown in FIG. 2F.

Figure 5A:
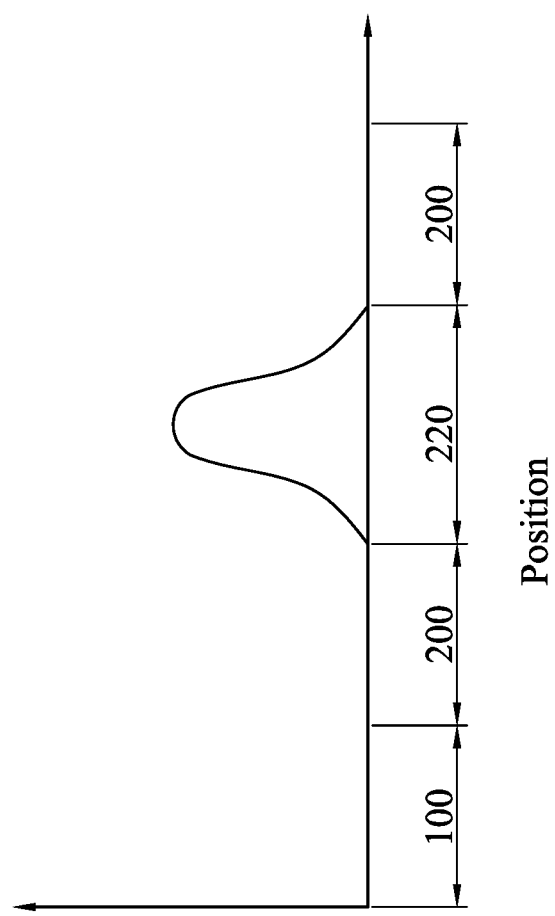
FIG. 5A illustrates a concentration profile of a foreign element in a semiconductor structure along line A-A in FIG. 2D in accordance with some embodiments.

In addition, during the planarization process, an energy-dispersive X-ray spectroscopy (EDX) technique is used to detecting a concentration of the foreign element in the doped dielectric layer 220 meanwhile. By comparing the concentration of the foreign element detected from EDX and the aforementioned predetermined concentration profile of the foreign element, a planarization depth is measured and a stop signal is obtained. For example, the concentration profile of the foreign element along line A-A in FIG. 2D is shown in FIG. 5A. As shown in FIG. 5A, the concentration of the foreign element appears only in the doped dielectric layer 220, thus once the concentration of the foreign element is first detected, the planarization process can be terminated at a top surface of the doped dielectric layer 220. Thus, the doped dielectric layer 220 works as a stop layer providing a stop signal for the planarization process. In other words, by properly setting doping parameters to form the doped dielectric layer 220 at a predetermined position, the planarization can be terminated at the top surface of the dielectric layer 220, where the concentration of the foreign element first detected, precisely and easily.

Furthermore, by comparing the detected concentration of the foreign element within the doped dielectric layer 220 with the predetermined concentration profile of the foreign element, a planarization depth can be measured and the planarization process can be terminated at a predetermined polarization depth in the doped dielectric layer 220. In addition, a dynamic change of the planarization depth is measured by a dynamic change of the concentration of the foreign element detected by a real-time EDX device during the planarization process. It should be noticed that, the foreign element in the aforementioned detected concentration and the predetermined concentration should not be limited to a specific foreign element but all kinds of foreign elements and the combination thereof, as the description related to the foreign element in FIG. 2D and step 1008 mentioned before.

Figure 2G:
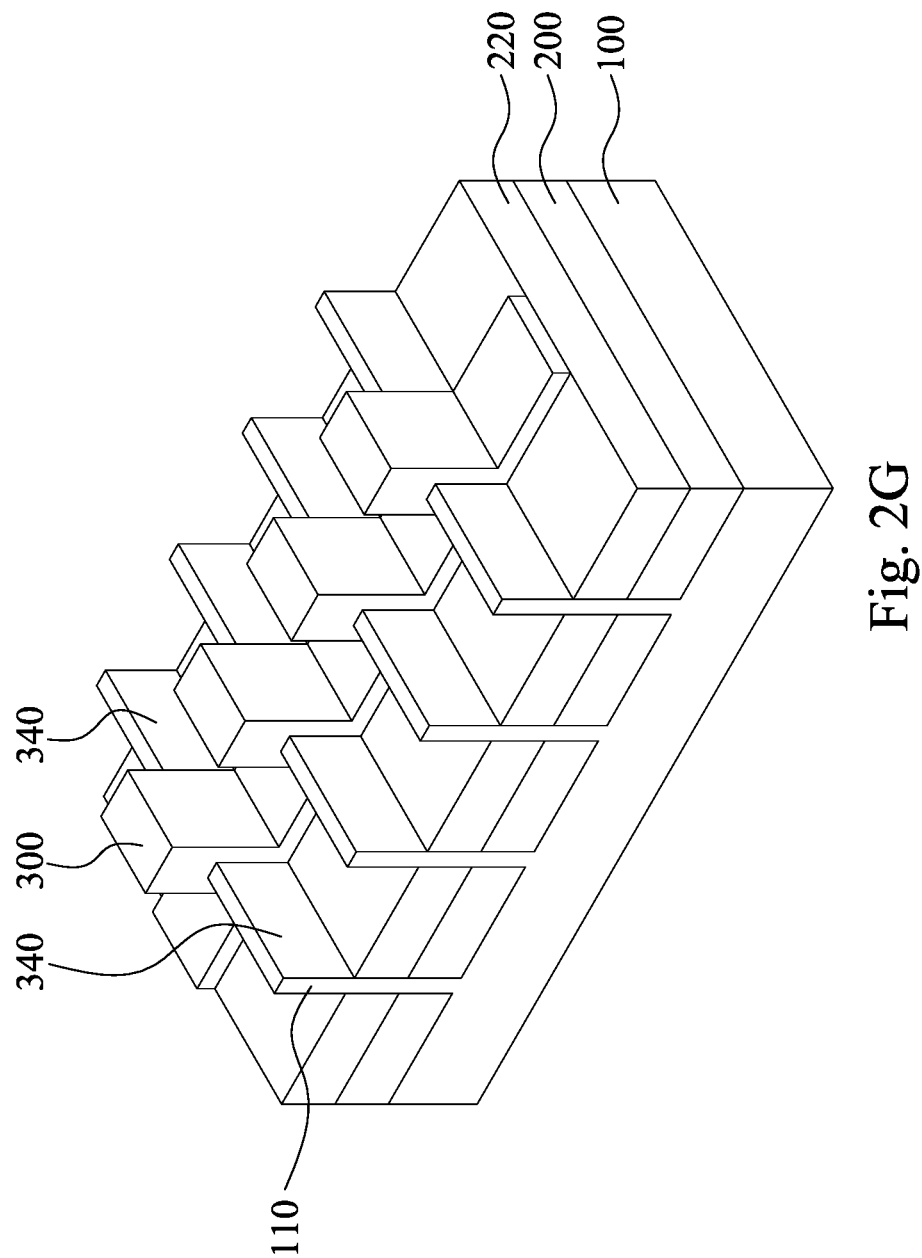

Referring to FIG. 1 and FIG. 2G, the method 1000 proceeds to step 1014 by forming a gate structure. After the fin structure 110 is exposed as shown in FIG. 2F, a gate structure 300 and an active area 340 are formed. The gate structure 300 may comprise a gate dielectric layer (not shown) and a gate electrode (not shown), wherein the gate dielectric layer is formed on the fin structure 110 and wraps around and follows the profile of the fin structure 110, while the gate electrode is formed on the gate dielectric layer without being physically connected to the fin structure 110. The gate dielectric layer may comprise LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials. While the gate electrode may comprise a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, or a combination thereof. In some embodiments, the gate dielectric layer and the gate electrode are formed by deposition, such as chemical vapor deposition (CVD).

Still referring to FIG. 2G, an active area 340 is formed in the fin structure 110. The active area 340 may comprise a source/drain region (not shown) on opposing sides of the gate structure 300. In some embodiments, the doped regions are lightly drain doped (LDD) regions, and are formed by implantation. For a n-type FinFET, the doped regions may include n-type dopants, such as phosphorus (P), arsenic (As), antimony (Sb), bismuth (Bi), selenium (Se), tellurium (Te), and a combination thereof. For the p-type FinFET, the doped regions may include p-type dopants, such as boron (B), boron difluoride ($BF_2$), and a combination thereof.

It should be recognized that the FinFET of FIG. 2G may include several other layers, structures, features, and so on in practical applications. That is to say, the basic and example FinFET of FIG. 2G is provided for context only. Thus, the present disclosure should not be limited to the FinFET as configured and depicted in FIG. 2G.

Figure 3:
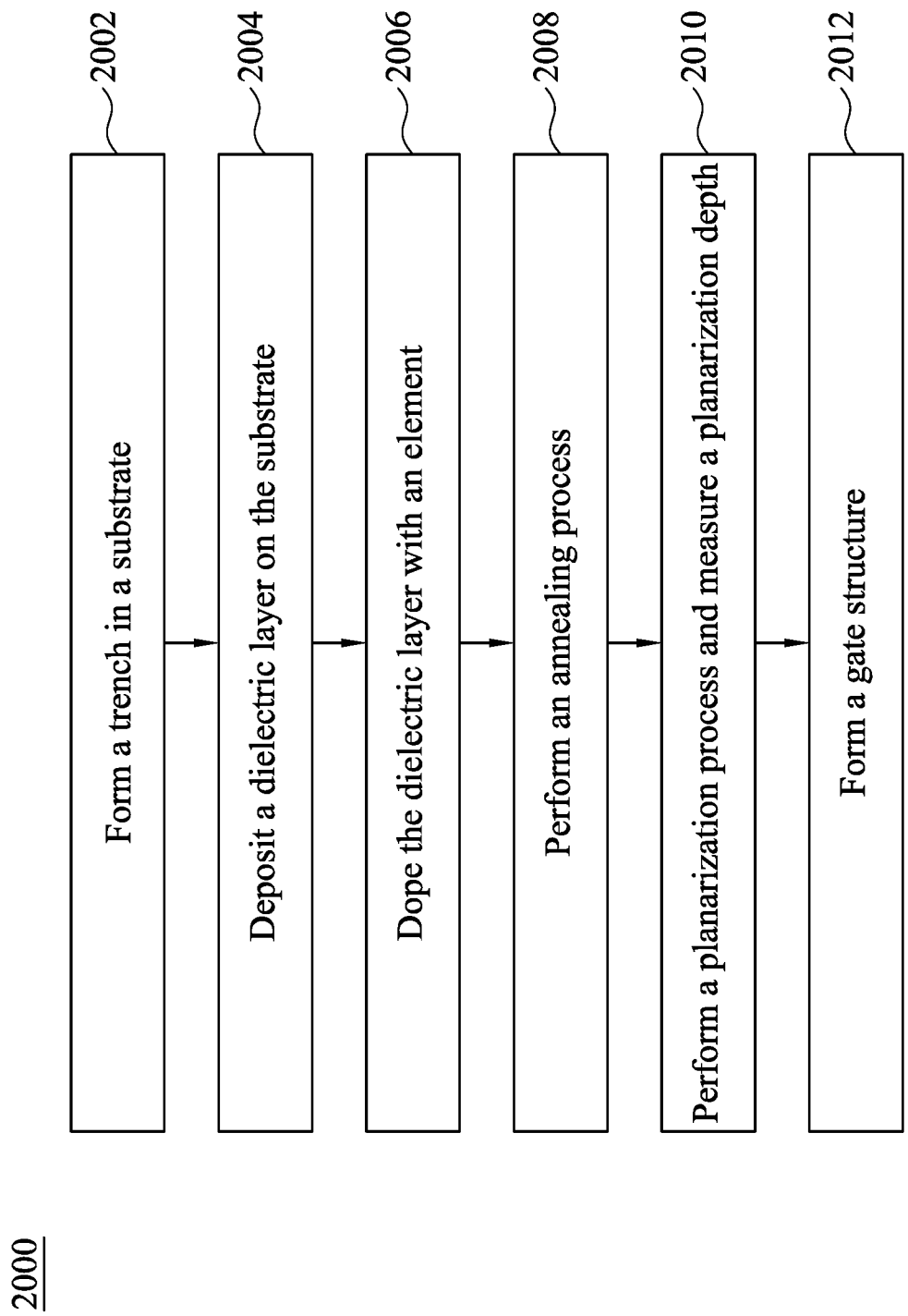
FIG. 3 illustrates a flow chart of an exemplary method for fabricating a planar FET semiconductor structure in accordance with some embodiments.

Now referring to FIG. 3, which is an exemplary flow chart for manufacturing a semiconductor planar FET structure according to one embodiment of the present disclosure. The flow chart illustrates only a relevant part of the entire manufacturing process. It is understood that additional operations may be provided before, during, and after the operations shown by FIG. 3, and some of the operations described below can be replaced or eliminated for additional embodiments of the method. The order of the operations/processes may be interchangeable.

As shown in FIG. 3, an embodiment method 2000 of controlling shallow trench isolation (STI) bending or cracking in a planar FET is provided. In step 2002, a trench is formed in a substrate. In step 2004, a dielectric layer is deposited on the substrate. In step 2006, the dielectric layer is doped with an element. In step 2008, an annealing process is performed. In step 2010, a planarization process is performed and a planarization depth is measured. In step 2012, a gate structure is formed.

Figure 4A:
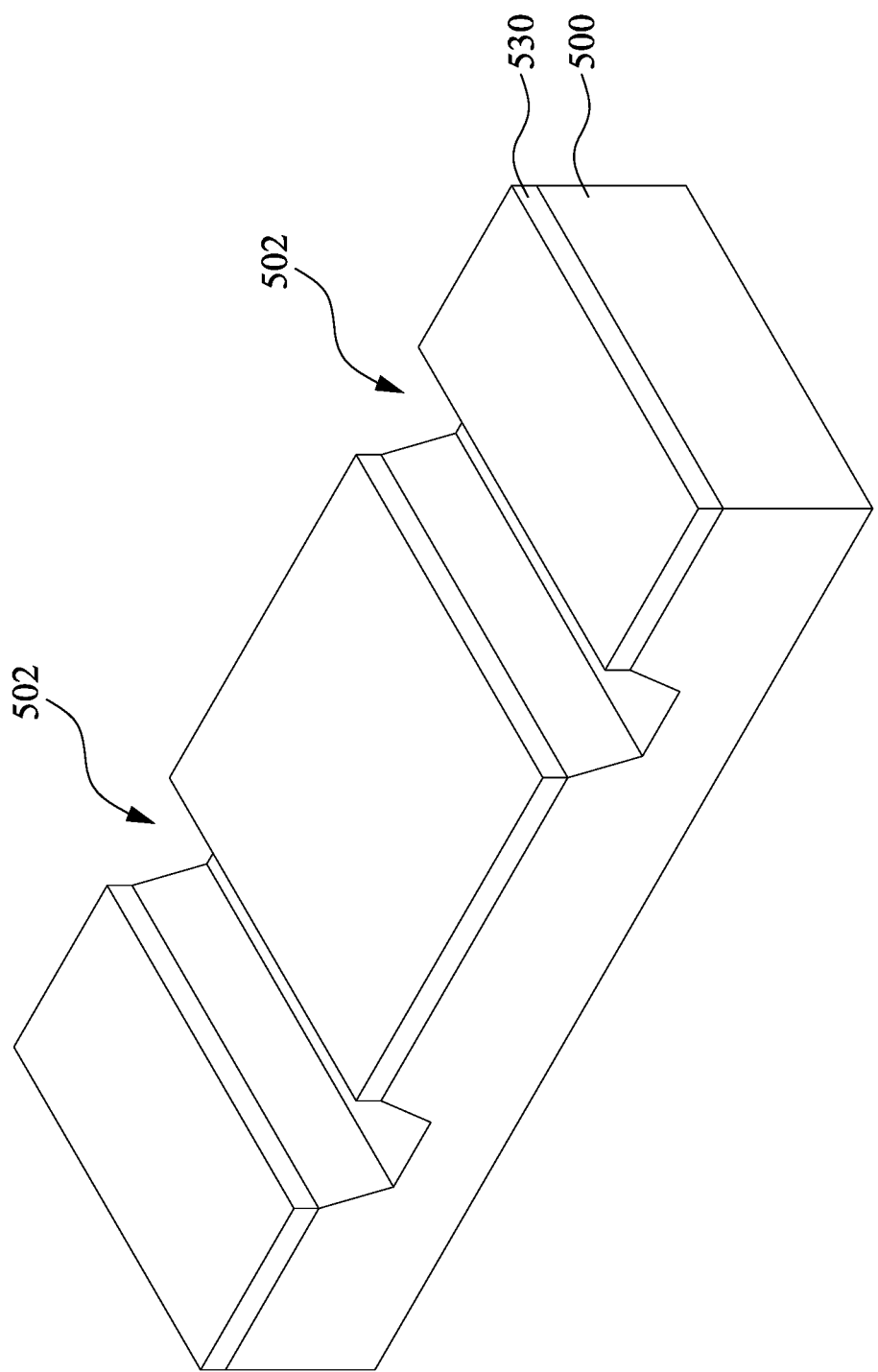
FIGS. 4A through 4E illustrate various structures of a planar FET semiconductor structure at different stages of fabrication in accordance with some embodiments.

Referring to FIG. 3 and FIG. 4A, the method 2000 starts from 2002 by forming a trench 502 in a substrate 500. As shown in FIG. 4A, a hard mask 530 is formed on a substrate 500 and the trench 502 is formed in the substrate 500. The substrate 500 may comprise silicon (Si) or a material similar to the material of the aforementioned substrate 100 in FIG. 2A. The hard mask trench 530 is formed by depositing a hard mask layer (not shown) over the substrate 500 and then patterned by a lithography process. Followed by an etching process to remove a portion of the substrate 500 to form a trench 502. Detailed description of processes may be referred to FIG. 2B mentioned above.

Figure 4B:
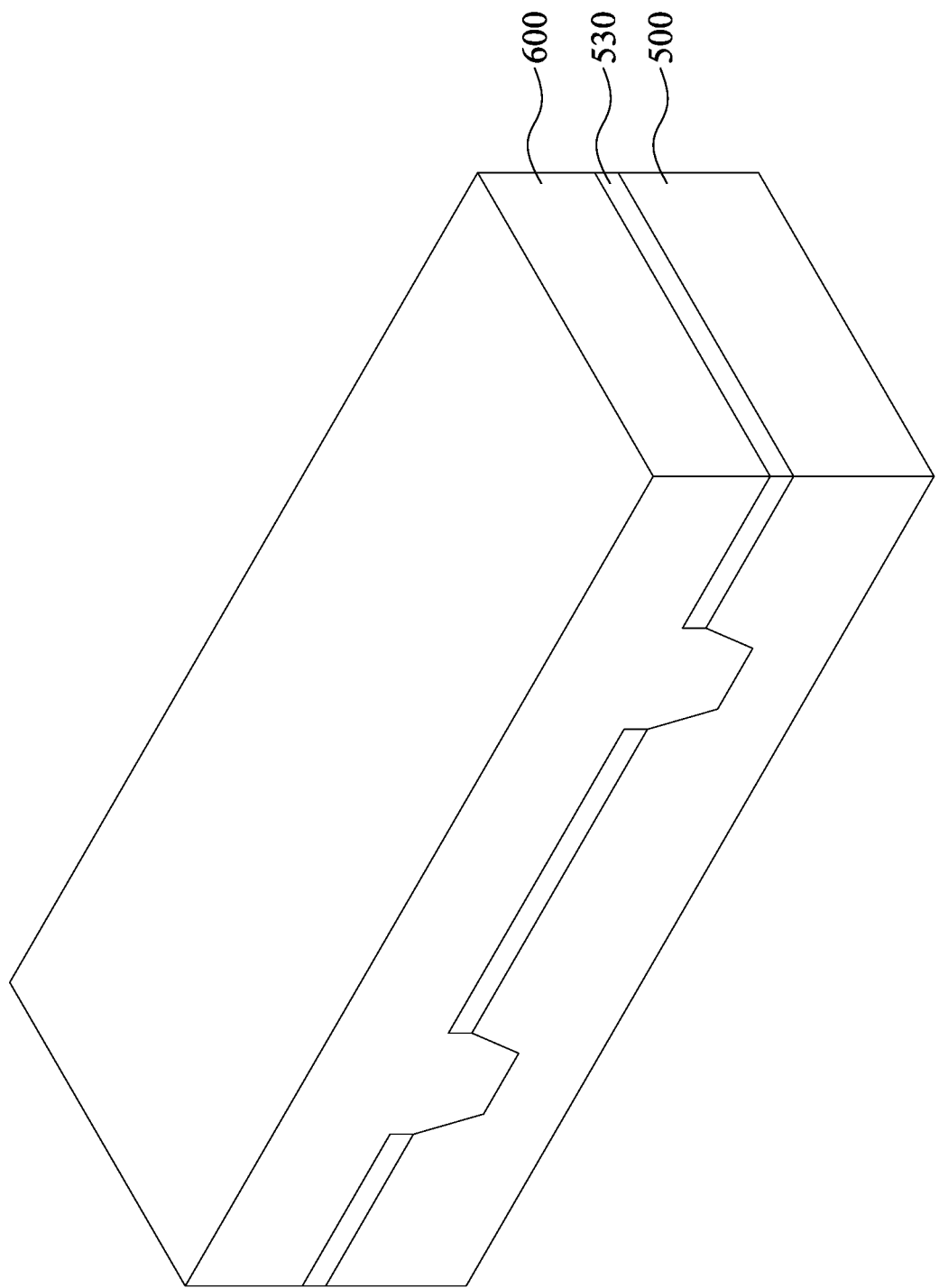

Referring to FIG. 3 and FIG. 4B, the method 2000 proceeds to 2004 by depositing a dielectric layer on the substrate 500. As shown in FIG. 4B, a dielectric layer 600 is formed on the substrate 500 and in the trench 502 by a suitable process such as, but not limited to, a deposition process. Detailed description of processes and materials may be referred to FIG. 2C mentioned above. In the embodiment, a portion of the dielectric layer 600 in the trench 502 forms a shallow trench isolation (STI).

Figure 4C:
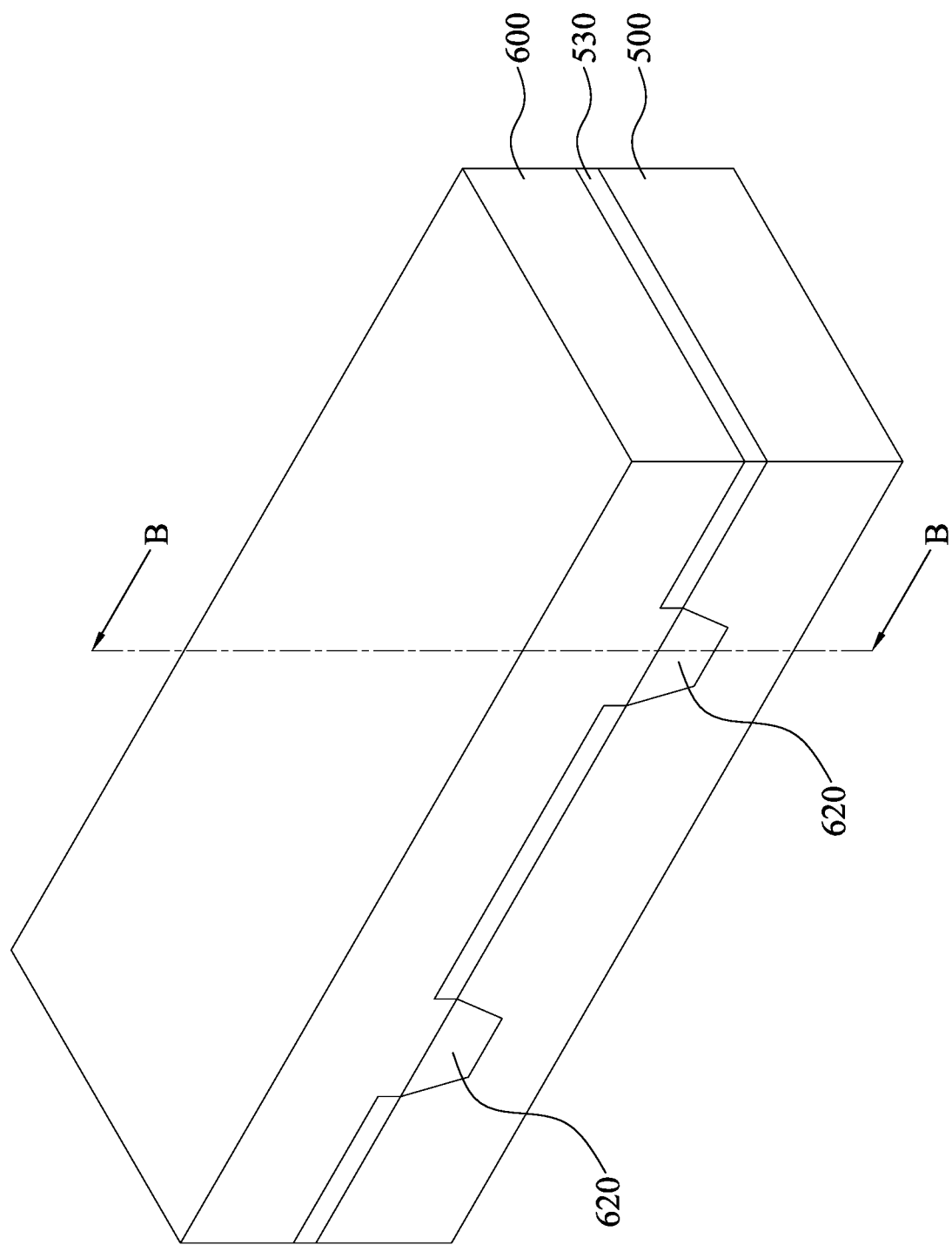

Referring to FIG. 3 and FIG. 4C, the method 2000 proceeds to 2006 by doping the dielectric layer with a foreign element (or foreign elements). As shown in FIG. 4C, a doped dielectric layer 620 is formed in the portion of the dielectric layer 600 in the trench 502. The doped dielectric layer 620 may be formed by a process similar to the process, ion implantation, of forming the aforementioned doped dielectric layer 220 in FIG. 2D. In addition, the foreign element doped into the dielectric layer 600 to forms a doped dielectric layer 620 is similar to the foreign element of the doped dielectric layer 220 as well. It should be noticed that the doped dielectric layer 620 has a predetermined concentration of the foreign element similar to the doped dielectric layer 220 as mentioned before. In the embodiment, a portion of the dielectric layer 600 in the trench 502 is transformed into the doped dielectric layer 620. In other embodiments, the doped dielectric layer 620 is formed at an upper, middle, or bottom part of the shallow trench isolation 502.

Referring to FIG. 3 and FIG. 4C, the method 2000 proceeds to 2008 by performing an annealing process. Detailed description of the annealing process is referred to the FIG. 2D mentioned above. Due to the smaller CTE difference between the doped dielectric layer 620 and the substrate 500, structural stress exerted on the substrate may be reduced to avoid structural defects in a semiconductor structure. In other embodiments, the annealing process may comprise multiple annealing processes with/without steam or different gases. In other embodiments, the annealing process and the ion implantation mentioned above are performed at the same time. In other embodiments, an additional annealing process may be performed after the planarization process.

Figure 4D:
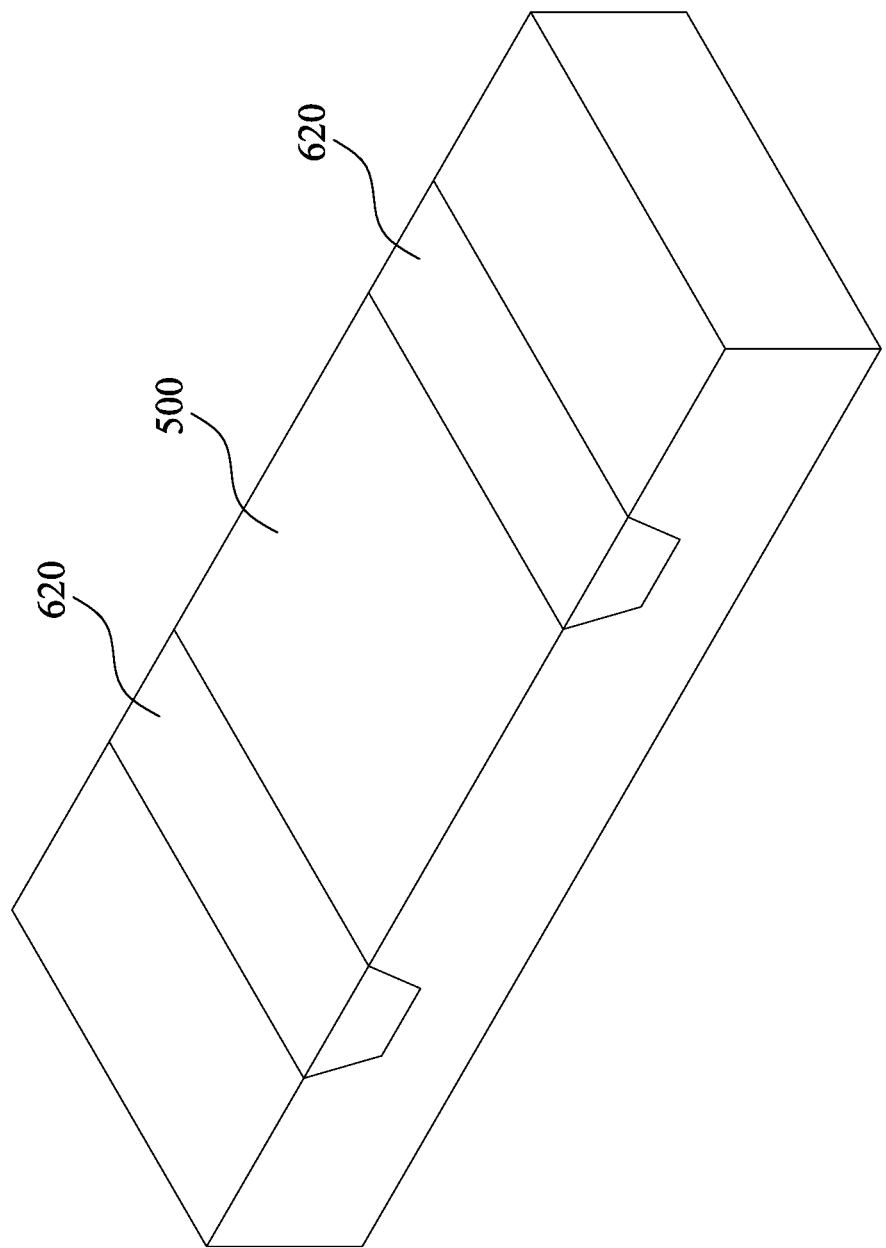
Figure 5B:
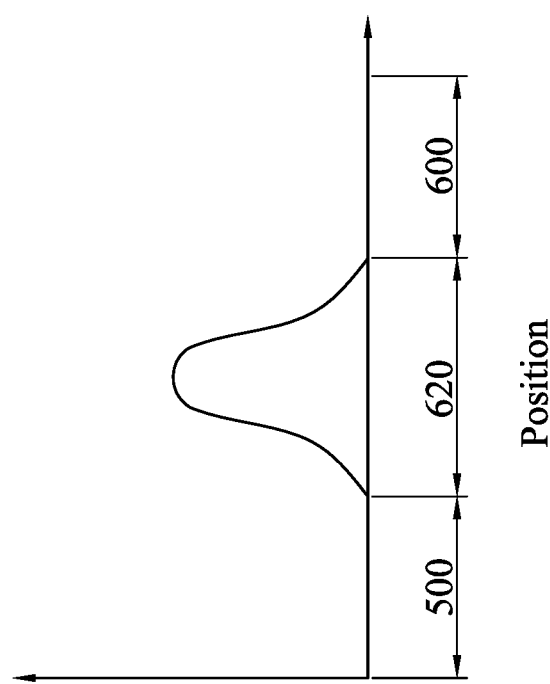
FIG. 5B illustrates a concentration profile of a foreign element in a semiconductor structure along line B-B in FIG. 4C in accordance with some embodiments.

Referring to FIG. 3 and FIG. 4D, the method 2000 proceeds to 2010 by performing a planarization process and measuring a planarization depth. As shown in FIG. 4D, the dielectric layer 600 and the hard mask 530 are removed by a planarization process, such as CMP or etching. Furthermore, FIG. 5B illustrates the concentration of the foreign element along line B-B in FIG. 4C detected by a real-time EDX device during the planarization process. As mentioned before in FIGS. 2E-2F, by detecting the concentration of the foreign element and comparing it to the predetermined concentration profile of the foreign element, a stop signal can be obtained and a planarization depth can be measured. Thus, the doped dielectric layer 620 functions as a stop layer for the planarization process.

Figure 4E:
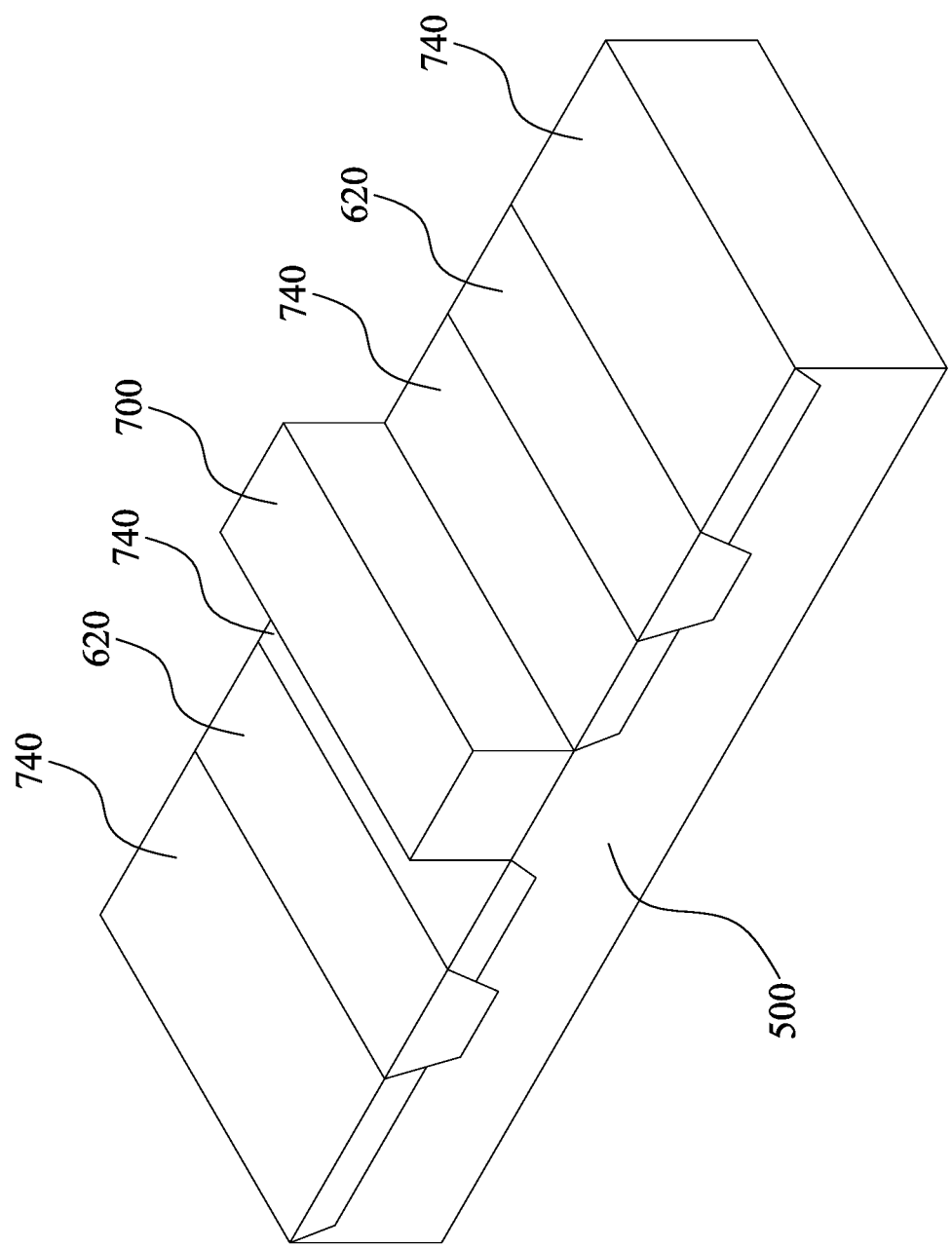

Referring to FIG. 1 and FIG. 4E, the method 1000 starts from 1012 by forming a gate structure 700 and an active area 740. An active area 740 is formed in the substrate 500 and a gate structure 700 is formed on the substrate 500 and between active areas 740. The gate structure 700 may comprise materials and structures similar to the gate structure 300 in FIG. 2G. In addition, a process for forming the gate structure 700 is similar to a process for forming the gate structure 300. The active area 740 may comprise a source/drain region (not shown) and may be formed by a similar process for forming the active area 340 as mentioned before in FIG. 2G.

It should be recognized that the planar FET of FIG. 4E may include several other layers, structures, features, and so on in practical applications. That is to say, the basic and example planar FET of FIG. 4E is provided for context only. Thus, the present disclosure should not be limited to the planar FET as configured and depicted in FIG. 4E.

As aforementioned, a method to decrease or eliminate fin bending or cracking in a FinFET is very important for improving performance and stability of a semiconductor structure. It is known that during an annealing process of a dielectric layer between fins supported by a substrate may result in an undesired structural stress. The structural stress may make the fin bended or cracked, hence, a method is needed for reducing or eliminating the structural stress so as to prevent fin bending or cracking from occurring. Furthermore, during the aforementioned planarization process, there exists no stop signal nor structure works as a stop layer in the semiconductor structure to provide a better controlling of a planarization depth.

A method disclosed according to the embodiment to solve the problem described above of the structural stress during an annealing process is doping the dielectric layer between the fin structures with a foreign element (or foreign elements) to form a doped dielectric layer. The doped dielectric layer may have a coefficient of thermal expansion (CTE) closer to a CTE of the fin structure, thus the structural stress exerted on the fin structure may be reduced or eliminated to prevent the fin structure from bending or cracking. In addition, by properly setting ion implantation parameters to form the doped dielectric layer in a predetermined position, the doped dielectric layer is formed in a predetermined position and has a predetermined concentration profile of the foreign element. By detecting the concentration of the foreign element by an EDX device during the planarization process and comparing it to the predetermined concentration profile of the foreign element, a stop signal is obtained and a planarization depth is measured as well. Thus, the doped dielectric layer works as a stop layer and makes the planarization process terminate at a predetermined planarization depth precisely and easily.

In accordance with some embodiments of the present disclosure, a semiconductor structure comprises a substrate comprising an active area, a trench in the substrate, a dielectric layer in the trench, and a stop layer adjacent the dielectric layer. The active area has a first coefficient of thermal expansion (CTE); the dielectric layer has a second CTE; and the stop layer has a third CTE. The first CTE, the second CTE, and the third CTE are different from one another.

In accordance with some embodiments of the present disclosure, a semiconductor structure comprises a substrate, a fin supported by the substrate, a trench between the fins, and an isolation layer in the trench, wherein a portion of the isolation layer is doped with an element. There is a stress between the fin and the portion of the isolation layer doped with an element.

In accordance with some embodiments of the present disclosure, a method for forming a semiconductor structure, the method comprising: forming a trench between fins supported by a substrate; depositing an isolation layer in the trench; doping a portion of the isolation layer with an element to form a doped isolation region; annealing the doped isolation region; planarizing the annealed and doped isolation region; and measuring a planarization depth of the annealed and doped isolation region based on a predetermined concentration profile of the element along the planarization depth of the annealed and doped isolation region.

In accordance with some embodiments of the present disclosure, a semiconductor structure includes a substrate including an active area having a first coefficient of thermal expansion (CTE), and a dielectric layer adjacent the active area. The dielectric layer includes a first region having a second CTE, and a second region having a third CTE, the second region having a higher concentration of a dopant than the first region, where a difference between the third CTE and the first CTE is less than a difference between the second CTE and the first CTE.

In accordance with some embodiments of the present disclosure, a semiconductor structure includes a fin supported by a substrate, and an isolation region over the substrate and adjacent the fin. The isolation region includes a first portion and a second portion, where the second portion of the isolation region has a higher concentration of a dopant than the first portion of the isolation region, where the first portion of the isolation region applies a first structural stress on the fin, where the second portion of the isolation region applies a second structural stress on the fin, and where the second structural stress is less than the first structural stress.

In accordance with some embodiments of the present disclosure, a semiconductor structure includes a plurality of fins supported by a substrate, the plurality of fins having a first coefficient of thermal expansion (CTE), and a plurality of isolation regions between adjacent fins, topmost surfaces of the plurality of fins being above topmost surfaces of the plurality of isolation regions. Each of the plurality of isolation regions includes a first portion having a second CTE, and a second portion over the first portion, the second portion having a higher concentration of a dopant than the first portion, the second portion having a third CTE, where a difference between the third CTE and the first CTE is less than a difference between the second CTE and the first CTE.

In accordance with some embodiments of the present disclosure, a semiconductor structure includes a substrate including an active area having a first coefficient of thermal expansion (CTE), and a dielectric layer adjacent the active area. The dielectric layer includes a first region having a second CTE, and a second region having a third CTE. The first region includes a first dielectric material. The second region includes the first dielectric material doped with a first dopant. A difference between the third CTE and the first CTE is less than a difference between the second CTE and the first CTE. A concentration of the first dopant in the second region reaches a maximum value within an interior of the second region.

In accordance with some embodiments of the present disclosure, a semiconductor structure includes a fin supported by a substrate, and an isolation region over the substrate and adjacent the fin. The isolation region includes a first portion, a second portion over the first portion, and first dopants in the second portion. A concentration of the first dopants in the second portion has a minimum value at a topmost surface of the second portion and a maximum value within an interior of the second portion. The first portion of the isolation region applies a first structural stress on the fin. The second portion of the isolation region applies a second structural stress on the fin. The second structural stress is less than the first structural stress.

In accordance with some embodiments of the present disclosure, a semiconductor structure includes a plurality of fins supported by a substrate and a plurality of isolation regions between adjacent fins. The plurality of fins have a first coefficient of thermal expansion (CTE). Topmost surfaces of the plurality of fins being above topmost surfaces of the plurality of isolation regions. Each of the plurality of isolation regions includes a first portion having a second CTE, a second portion over the first portion, and first dopants in the second portion. The second portion has a third CTE. A concentration of the first dopants in the second portion has a minimum value at an interface between the first portion and the second portion and a maximum value within an interior of the second portion. A difference between the third CTE and the first CTE is less than a difference between the second CTE and the first CTE.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
   a substrate comprising an active area having a first coefficient of thermal expansion (CTE); and
   a dielectric layer adjacent the active area, the dielectric layer comprising:
      a first region having a second CTE, the first region comprising a first dielectric material; and
      a second region having a third CTE, the second region comprising the first dielectric material doped with a first dopant, wherein a difference between the third CTE and the first CTE is less than a difference between the second CTE and the first CTE, and wherein a concentration of the first dopant in the second region reaches a maximum value within an interior of the second region.

2. The semiconductor structure of claim 1, wherein the second region of the dielectric layer applies a tensile stress on the active area in a range from 0.01 GPa to 0.15 GPa.

3. The semiconductor structure of claim 1, wherein the second region of the dielectric layer applies a compressive stress on the active area in a range from 0.01 GPa to 0.2 GPa.

4. The semiconductor structure of claim 1, wherein the first dopant comprises an element of metalloid, nonmetal, or both.

5. The semiconductor structure of claim 4, wherein the element is selected from a group consisting of B, C, N, P, Ge, and a combination thereof.

6. The semiconductor structure of claim 1, wherein the second region of the dielectric layer is over the first region of the dielectric layer.

7. The semiconductor structure of claim 1, wherein the first region of the dielectric layer applies a first structural stress on the active area, wherein the second region of the dielectric layer applies a second structural stress on the active area, and wherein the first structural stress is greater than the second structural stress.

8. A semiconductor structure comprising:
   a fin supported by a substrate; and
   an isolation region over the substrate and adjacent the fin, the isolation region comprising:
      a first portion;
      a second portion over the first portion; and
      first dopants in the second portion, wherein a concentration of the first dopants in the second portion has a minimum value at a topmost surface of the second portion and a maximum value within an interior of the second portion, wherein the first portion of the isolation region applies a first structural stress on the fin, wherein the second portion of the isolation region applies a second structural stress on the fin, and wherein the second structural stress is less than the first structural stress.

9. The semiconductor structure of claim 8, wherein the first dopants comprise ions of B, C, N, P, Ge, or a combination thereof.

10. The semiconductor structure of claim 8, wherein the second structural stress is a tensile stress in a range from 0.01 GPa to 0.15 GPa.

11. The semiconductor structure of claim 8, wherein the second structural stress is a compressive stress in a range from 0.01 GPa to 0.2 GPa.

12. The semiconductor structure of claim 8, wherein the fin has a first coefficient of thermal expansion (CTE), the first portion of the isolation region has a second CTE, and the second portion of the isolation region has a third CTE, and wherein a difference between the third CTE and the first CTE is less than a difference between the second CTE and the first CTE.

13. The semiconductor structure of claim 8, wherein the first dopants are distributed in the second portion of the isolation region according to a Gaussian distribution.

14. The semiconductor structure of claim 8, wherein a topmost surface of the fin is above a topmost surface of the isolation region.

15. A semiconductor structure comprising:
a plurality of fins supported by a substrate, the plurality of fins having a first coefficient of thermal expansion (CTE); and
a plurality of isolation regions between adjacent fins, topmost surfaces of the plurality of fins being above topmost surfaces of the plurality of isolation regions, each of the plurality of isolation regions comprising:
a first portion having a second CTE;
a second portion over the first portion, the second portion having a third CTE; and
first dopants in the second portion, wherein a concentration of the first dopants in the second portion has a minimum value at an interface between the first portion and the second portion and a maximum value within an interior of the second portion, and wherein a difference between the third CTE and the first CTE is less than a difference between the second CTE and the first CTE.

16. The semiconductor structure of claim 15, wherein second portions of the plurality of isolation regions apply less structural stress on respective adjacent fins than first portions of the plurality of isolation regions.

17. The semiconductor structure of claim 15, wherein second portions of the plurality of isolation regions apply a tensile stress on respective adjacent fins in a range from 0.01 GPa to 0.15 GPa.

18. The semiconductor structure of claim 15, wherein second portions of the plurality of isolation regions apply a compressive stress on respective adjacent fins in a range from 0.01 GPa to 0.2 GPa.

19. The semiconductor structure of claim 15, further comprising a gate structure extending along sidewalls and the topmost surfaces of the plurality of fins, and along the topmost surfaces of the plurality of isolation regions.

20. The semiconductor structure of claim 15, wherein the first dopants comprise ions of B, C, N, P, Ge, or a combination thereof.

* * * * *